(12) United States Patent
Brooks

(10) Patent No.: US 9,165,088 B2
(45) Date of Patent: Oct. 20, 2015

(54) APPARATUS AND METHOD FOR MULTI-MODE STORAGE

(71) Applicant: Hewlett-Packard Development Company, L.P., Houston, TX (US)

(72) Inventor: Robert J. Brooks, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 303 days.

(21) Appl. No.: 13/936,986

(22) Filed: Jul. 8, 2013

(65) Prior Publication Data

US 2015/0012695 A1     Jan. 8, 2015

(51) Int. Cl.
| | |
|---|---|
| *G06F 12/00* | (2006.01) |
| *G06F 17/30* | (2006.01) |
| *G06F 12/08* | (2006.01) |
| *G11C 15/00* | (2006.01) |

(52) U.S. Cl.
CPC ...... *G06F 17/30982* (2013.01); *G06F 12/0895* (2013.01); *G11C 15/00* (2013.01)

(58) Field of Classification Search
None
See application file for complete search history.

(56) References Cited

U.S. PATENT DOCUMENTS

| | | | |
|---|---|---|---|
| 5,136,691 | A | 8/1992 | Baror |
| 7,539,810 | B2 | 5/2009 | Gower et al. |
| 7,620,778 | B2 * | 11/2009 | Mohammad et al. ......... 711/144 |
| 8,059,440 | B2 | 11/2011 | Chiang |
| 2001/0017798 | A1 | 8/2001 | Ishii |
| 2006/0212648 | A1 * | 9/2006 | Cox et al. ...................... 711/108 |
| 2008/0276039 | A1 * | 11/2008 | Cox et al. ...................... 711/108 |

OTHER PUBLICATIONS

Kim, K-H., High Density Crossbar Structure for Memory Application, (Research Paper), 2011.

* cited by examiner

*Primary Examiner* — Brian Peugh
(74) *Attorney, Agent, or Firm* — Mannava & Kang, P.C.

(57) ABSTRACT

According to an example, multi-mode storage may include operating a first array including a first memory and a second array including a second memory in one or more modes of operation. The first memory may be a relatively denser memory compared to the second memory and the second memory may be a relatively faster memory compared to the first memory. The modes of operation may include a first mode of operation where the first array functions as the relatively denser memory compared to the second memory and the second array functions as the relatively faster memory compared to the first memory, a second mode of operation where the second array is operated as an automatic cache of a portion of a dataset, and a third mode of operation where a cache-tag functionality used to support the second mode of operation is instead used to provide a CAM.

15 Claims, 5 Drawing Sheets

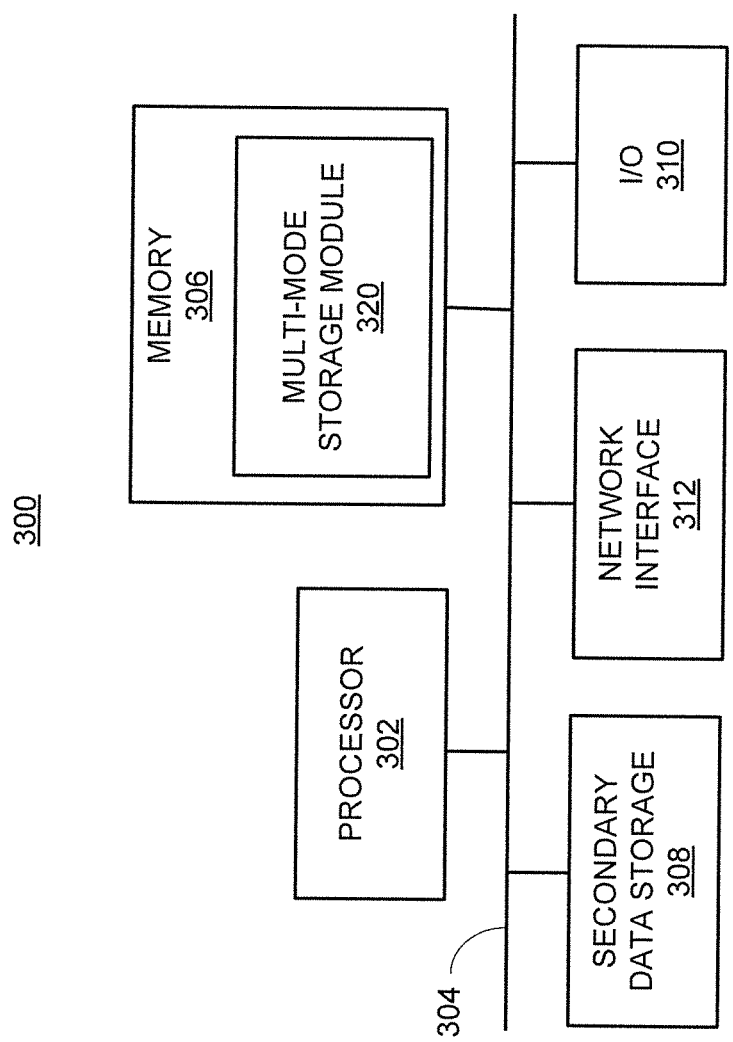

APPARATUS AND METHOD FOR MULTI-MODE STORAGE

BACKGROUND

A content-addressable memory (CAM) is a type of computer memory that can be used for certain high speed searching purposes. Compared to computer memory such as random access memory (RAM) in which a user supplies a memory address and the RAM returns a data word stored at that address, for a CAM, a user typically supplies a data word and the entire CAM is searched to determine if that data word is stored anywhere in the CAM. If the data word is located, the CAM may return a list of one or more storage addresses where the data word was found, and may also return the data word, or other associated data.

BRIEF DESCRIPTION OF DRAWINGS

Features of the present disclosure are illustrated by way of example and not limited in the following figure(s), in which like numerals indicate like elements, in which:

FIG. 5 illustrates a computer system, according to an example of the present disclosure.

DETAILED DESCRIPTION

Figure 1:
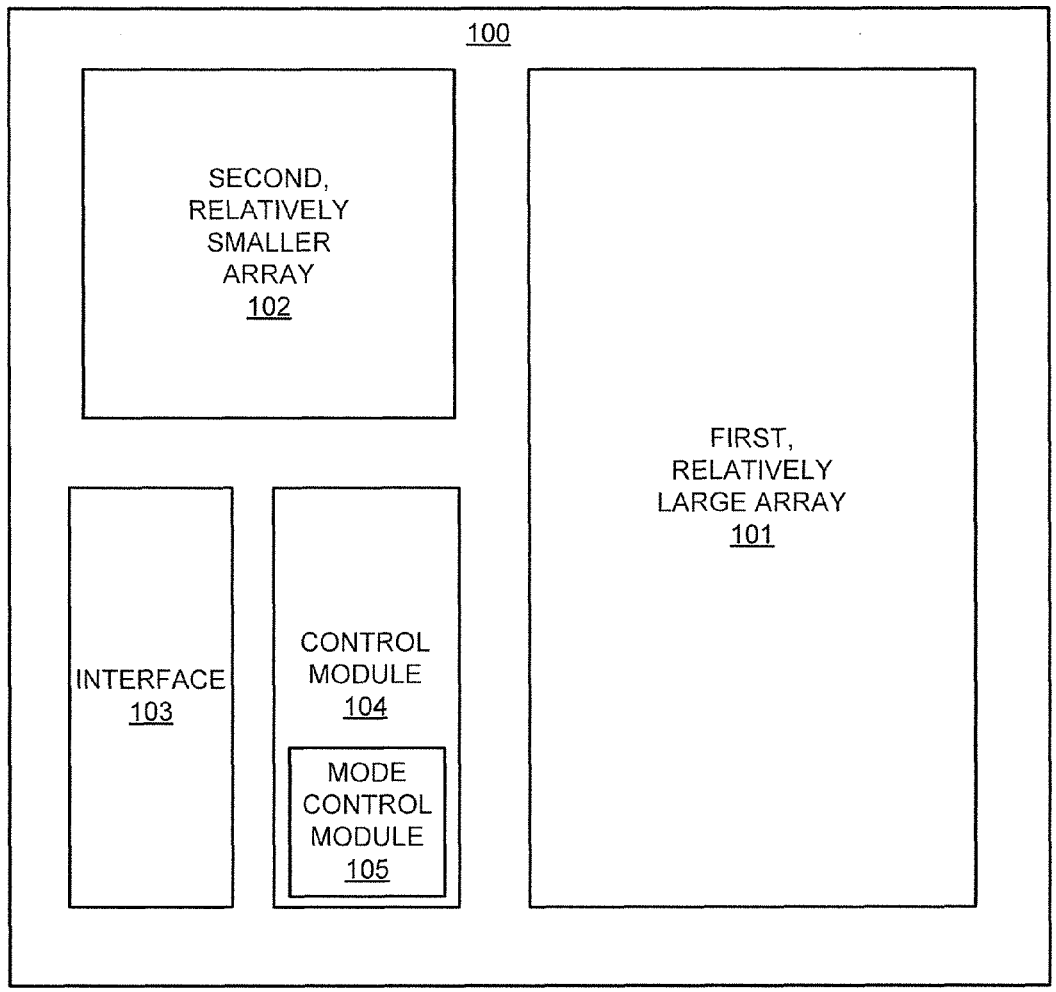
FIG. 1 illustrates an architecture of a multi-mode storage apparatus, including a first, relatively large, array, and a second, relatively smaller, array, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

A CAM may be used, for example, as fully associative caches and translation lookaside buffers (TLBs). These CAM functions may be considered encapsulated custom functions. CAM functionality however is not flexible or exposed to application use (i.e., use by software). For example, for software to perform CAM functions such as searching for a data word supplied by a user to determine if that data word is stored anywhere in the CAM, and if the data word is located, returning a list of one or more storage addresses where the data word was found, such functions would need to be performed in a sequential manner. The sequential processing of such functions in data can take a relatively long time compared to the time it would take for the functions to be performed by the CAM.

According to an example, a multi-mode storage apparatus and a method for multi-mode storage are disclosed herein. The multi-mode storage apparatus may include a first, relatively large, array, and a second, relatively smaller, array. The first array may include a first memory and the second array may include a second memory. The first memory may be a relatively denser memory compared to the second memory and the second memory may be a relatively faster memory compared to the first memory. For example, the first memory may be considered to be a relatively denser memory such that the first memory stores a greater amount of information on a given length of track, area of surface, and/or in a given volume compared to the second memory. Further, the second memory may be considered to be a relatively faster memory such that the second memory includes, for example, a higher data transfer rate compared to the first memory. The multi-mode storage apparatus may further include a supporting interface, and control logic. The multi-mode storage apparatus may operate in one of four modes, or a combination thereof. In a first mode of operation, the multi-mode storage apparatus may operate such that the first array functions as a relatively denser memory compared to the second memory, and the second array functions as a relatively faster memory compared to the first memory. In a second mode of operation, the multi-mode storage apparatus may operate such that the second array is operated as an automatic cache of a portion of a dataset. In a third mode of operation, the multi-mode storage apparatus may operate such that a cache-tag functionality used to support the second mode of operation is instead used to provide a CAM. Further, in a fourth mode of operation, the multi-mode storage apparatus may operate such that the CAM functionality is offered in an abstracted manner that can offload significant processing time from a processor by storing and retrieving key-value pairs.

According to an example, the method for a multi-mode storage may include operating, by a processor, a first array including a first memory and a second array including a second memory in one or more of a plurality of modes of operation. The first memory may be a relatively denser memory compared to the second memory and the second memory may be a relatively faster memory compared to the first memory. The modes of operation may include a first mode of operation where the first array functions as the relatively denser memory and the second array functions as the relatively faster memory, a second mode of operation where the second array is operated as an automatic cache of a portion of a dataset, and a third mode of operation where a cache-tag functionality used to support the second mode of operation is instead used to provide a CAM.

The multi-mode storage apparatus and the method for multi-mode storage may expose a CAM for application usage to provide a resource that can significantly enhance performance. For the apparatus and method disclosed herein, when the CAM is not needed for application usage, the CAM may provide a cache for more general application usage (e.g., to improve application performance). Further, the CAM may also provide a cache for more general application usage for predetermined time periods during application runtime. The apparatus and method disclosed herein may also provide for integration of higher level abstractions, such as key/value lookup, to further enhances performance by implementing such functions in hardware, and thus providing improved performance compared to implementation of such functions in software. The apparatus and method disclosed herein may be implemented, for example, as a memory chip or a memory IP block included on a system on chip (SoC).

FIG. 1 illustrates an architecture of a multi-mode storage apparatus 100, according to an example. Referring to FIG. 1, the apparatus 100 is depicted as including a first array 101, and a second array 102. The first array 101 may include a relatively larger storage capacity compared to the second array 102, and thus may be designated a first, relatively large, array 101. The second array 102 may include a relatively smaller storage capacity compared to the first array 101, and thus may be designated a second, relatively smaller, array 102. The first array 101 may include relatively denser memory compared to the second array 102, and the second array 102 may include relatively faster memory compared to the first array 101. The multi-mode storage apparatus 100 may further include a supporting interface 103, and control module 104. The multi-mode storage apparatus 100 may operate in one of four modes of operation, or a combination thereof. The control module 104 may provide for general control of the various functions of the apparatus 100. Further, the control module 104 may include a mode control module 105 (e.g., including mode control registers) to control operation of the apparatus 100 for the first to fourth modes of operation described herein. The control module 104 may also include a state machine or microcontroller to manage sequential operations of the first, relatively large, array 101, and the second, relatively smaller, array 102, as described herein. The control module 104 may further include an error checking and correcting (ECC) logic, and/or static redundancy schemes, such as row/column replacement.

The modules and other components of the apparatus 100 that perform various other functions in the apparatus 100, may comprise machine readable instructions stored on a computer readable medium. In addition, or alternatively, the modules and other components of the apparatus 100 may comprise hardware or a combination of machine readable instructions and hardware.

As discussed herein, the multi-mode storage apparatus 100 may operate in one of four modes of operation, or a combination thereof. In a first mode of operation, the multi-mode storage apparatus 100 may operate such that the first, relatively large, array 101 functions as a relatively denser memory compared to the memory of the second array 102, and the second, relatively smaller, array 102 functions as a relatively faster memory compared to the memory of the first array 101. A first address range may be assigned to locations within the first, relatively large, array 101, and a second distinct address range may be assigned to locations within the second, relatively smaller, array 102. In the first mode of operation, central processing unit (CPU) hardware or software may decide which portion of a dataset has a higher response time sensitivity (i.e., data that is subject to a higher data transfer rate) and is below a certain size, and therefore appropriate to place in the second, relatively smaller, array 102, with data not meeting these criteria being assigned to the first, relatively large, array 101.

In the second mode of operation, the multi-mode storage apparatus 100 may operate such that the second, relatively smaller, array 102 is operated as an automatic cache of a portion of a dataset. For example, in the second mode of operation, the second, relatively smaller, array 102 is operated as an automatic cache for the first, relatively large, array 101. Data related to incoming writes may be temporarily buffered in the second, relatively smaller, array 102, immediately acknowledged as committed to a sender, and released from the second, relatively smaller, array 102 after being successfully written to the first, relatively large, array 101. Data related to incoming reads may be checked for residence in the second, relatively smaller, array 102, and then fetched from the first, relatively large, array 101 if not present. Data related to the incoming reads may then be held in the second, relatively smaller, array 102 for a predetermined time period in the event the data related to the incoming reads is accessed again, for example, within another predetermined time period. One or more replacement techniques, such as least recently used (LRU) may be modally applied to make decisions as to the data that should be cached in the second, relatively smaller, array 102 and data that should be discarded. Although the second mode is automatic and transparent to an attached processor, the processor may provide hint bits on an access to indicate that a datum is a good candidate for caching or not. For example, a particular datum may be known to be frequently accessed by an application. In this regard, a hint bit may be called to determine whether a datum is a good candidate for caching or not.

In the third mode of operation, the multi-mode storage apparatus 100 may operate such that a cache-tag functionality (i.e., a tag per cache line) used to support the second mode of operation is instead used to provide a CAM. For example, tags may collectively form a CAM, and a match on a tag may select, for example, non-tagged bits, that are associated with the match. The second, relatively smaller, array 102 may be directly usable as a CAM in the third mode, and the first, relatively large, array 101 may remain fully available for general memory usage. Thus, the architecture of the CAM may be fully exposed to a connected device for the CAM to be utilized in any manner desired. For example, the CAM may be fully exposed for direct use by software.

In the fourth mode of operation, the multi-mode storage apparatus 100 may operate such that the CAM functionality is offered in an abstracted manner that can offload significant processing time from a processor in storing and retrieving key-value pairs. A processor may present keys and values of a flexible range of sizes. The second, relatively smaller, array 102 may be used to store key-value pairs until the second, relatively smaller, array 102 is filled. Then the first, relatively large, array 101 may be used. At this point, instead of data residing directly in the second, relatively smaller, array 102, pointers to locations in the first, relatively large, array 101 may be stored in the second, relatively smaller, array 102. For example, match fields, as described below, of the second, relatively smaller, array 102, may be used to store keys, and data fields, as described below, may be used with the match fields to either store an associated data value or a pointer to a location of storage of the data value. By using the match fields and data fields as discussed herein for the fourth mode of operation, the multi-mode storage apparatus 100 accounts for data fields that are larger than the storage capabilities of the second, relatively smaller, array 102. For the fourth mode of operation, the multi-mode storage apparatus 100 may initially include sufficient CAM tag space to hold all the keys. However, if the CAM tag space is consumed, operation may transparently shift to a mode where the tags are hashes of multiple keys. For example, if there is insufficient space to hold all of the keys, the keys may also be stored in the data fields. However, storage of the keys in the data fields may limit performance of a hardware match function. Thus the control module 104 may form a hash of a predetermined number of keys (e.g., four keys) that are stored, and store the hash in match cells of the match fields, as described in further detail with reference to FIGS. 2 and 3.

For the multi-mode storage apparatus 100, the control module 104 may automatically disambiguate the four modes operation in a multi-cycle operation. Further, the control module 104 may provide for the concurrent operation of one or more modes of operation. For example, for the third mode of operation, if CAM usage does not consume all the entries, and the remaining entries may be used as a cache for the second mode of operation.

Figure 2:
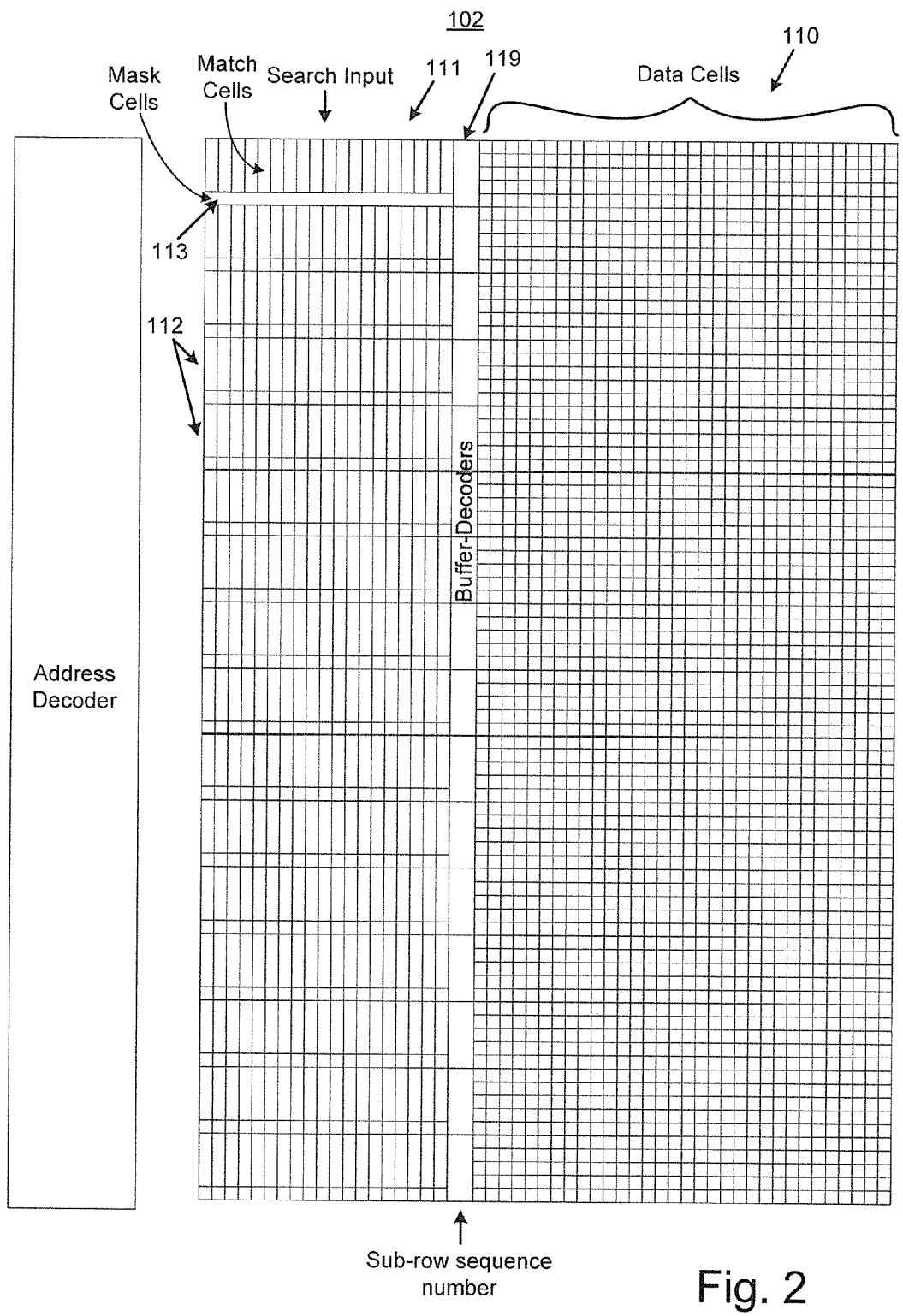
FIG. 2 illustrates an architecture of the second, relatively smaller, array, for the multi-mode storage apparatus, according to an example of the present disclosure.

Referring to FIGS. 1 and 2, FIG. 2 illustrates an architecture of the second, relatively smaller, array 102, according to an example of the present disclosure. The first, relatively large, array 101 may include the functionality of a random-access memory (RAM). The second, relatively smaller, array 102 may include row-sets divided into fields. A first data field 110 may include data cells such as RAM cells. A second match field 111 may include match cells that can either be used as CAM cells or RAM cells. The match field 111 may occupy part of one row, for example, a row 112. The data field 110 may logically occupy the remainder of that row (i.e., the remainder of each of the rows 112). However, because data bits may be relatively smaller than match bits, the physical arrangement of the second, relatively smaller, array 102 may be designed to accommodate the foregoing aspects for optimal density. For each row 112 of the match field 111, mask cells 113 for mask bits may be disposed directly under match cells to implement a ternary content addressable memory (TCAM). For example, a ternary in TCAM may include 1, 0, or "don't care" states. Thus the mask cells may implement the "don't care" state.

For the second, relatively smaller, array 102, when the second, relatively smaller, array 102 is used as a cache, for each pair of the rows 112, some of the bits may be used as control and status bits. Such bits may include, for example, valid, modified, and bits for an age counter. The bits for the age counter may be used to implement a replacement process, as opposed to random replacement. Since fewer match bits may be needed in cache mode than would be provided for explicit CAM usage, the cache control and status bits may be overloaded with unused match bits.

Figure 3:
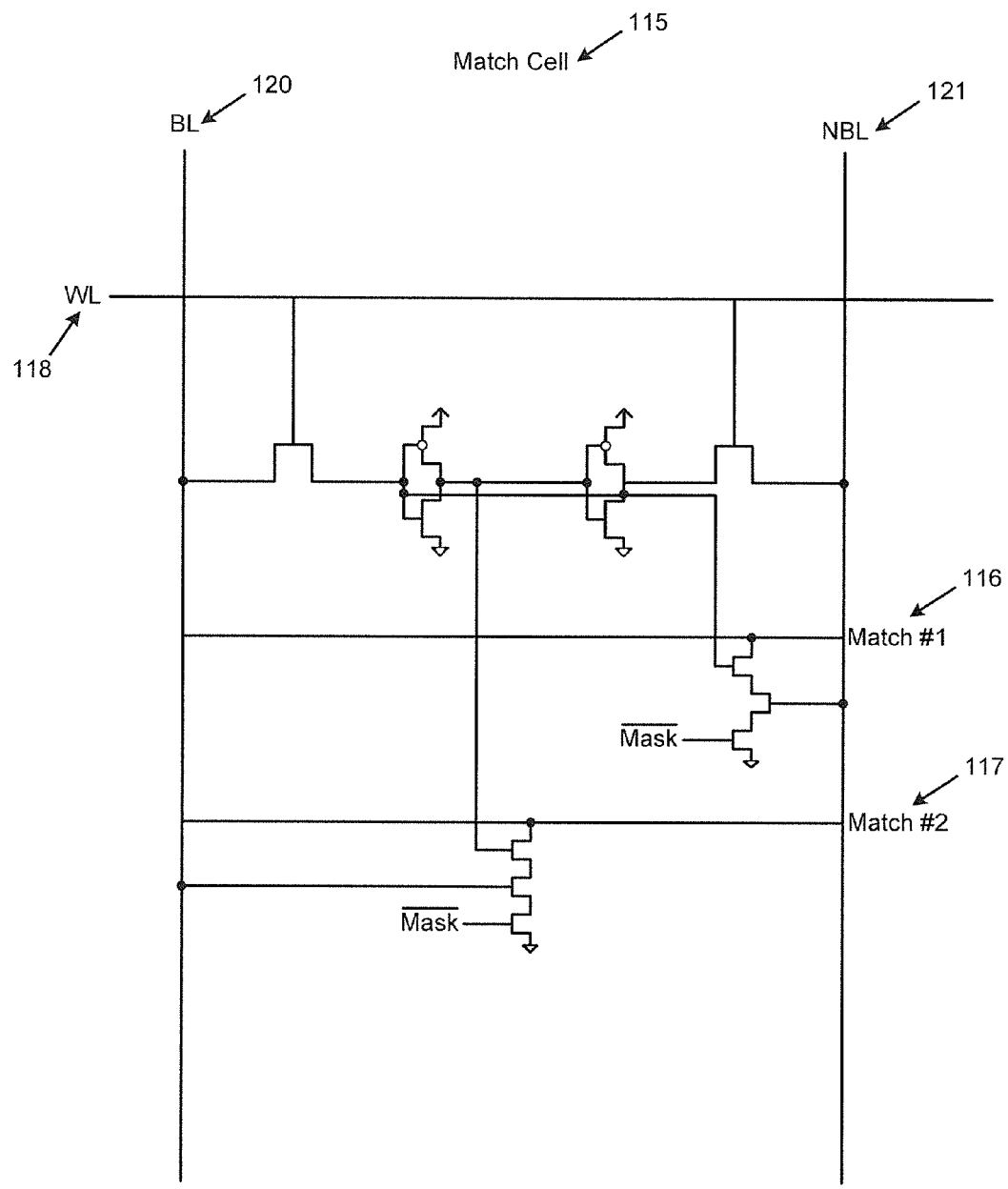
FIG. 3 illustrates an architecture of a match cell, according to an example of the present disclosure.

Referring to FIGS. 1-3, FIG. 3 illustrates an architecture of a match cell 115 of the match field 111, according to an example of the present disclosure. A pair of match lines 116 and 117 (i.e., match #1 and match #2) may proceed through each of the match bits, row-wise, in addition to a wordline 118. The match lines 116 and 117 may thus function as bus lines through each of the match bits. The wordline 118 and the match lines 116 and 117 may include a discontinuity 119 (see FIG. 2) between the match field 111 and the data field 110. A gate/buffer may detect a match via the lack of a pulldown on either one of the match lines 116 and 117, and drive the data field 110 wordlines accordingly.

Depending, for example, on operating frequency, process technology, and array size implemented for the second, relatively smaller, array 102, the readout of stored data may occur on the same cycle that search data was driven, or on a following cycle. For example, if the multi-mode storage apparatus 100 is operating at a slow frequency relative to processing capabilities, then the readout of stored data may occur on the same cycle that search data was driven. Alternatively, if the multi-mode storage apparatus 100 is operating at a fast frequency relative to processing capabilities, then multiple cycles may be needed for the readout of stored data. In order to accommodate the needed physical arrangement of data bits per logical row, subsets of data may be driven out on successive cycles. For example, instead of reading all data bits in parallel, data bits may be read in a plurality of sequential cycles to account for the needed physical arrangement of data bits per logical row.

Search data may be driven vertically through the second, relatively smaller, array 102 on complementary pairs of bit lines (e.g., bit line (BL) 120 and negative bit line or inverse bit line (NBL) 121). According to the example, the match cell 115 may include six field-effect transistors (FETs) between each match wordline and ground to provide match and mask computation. For example, if a storage cell is a 6T static random-access memory (SRAM) cell, a match cell includes twelve transistors. The match cell 115 may also be a memristive crosspoint and a read buffer with complementary outputs.

The control module 104 may include an error checking and correcting (ECC) logic, and/or static redundancy schemes, such as row/column replacement. Additional bits used for ECC rows, and additional rows and columns for static redundancy schemes may be provided in the first, relatively large, array 101, and the second, relatively smaller, array 102.

Figure 4:
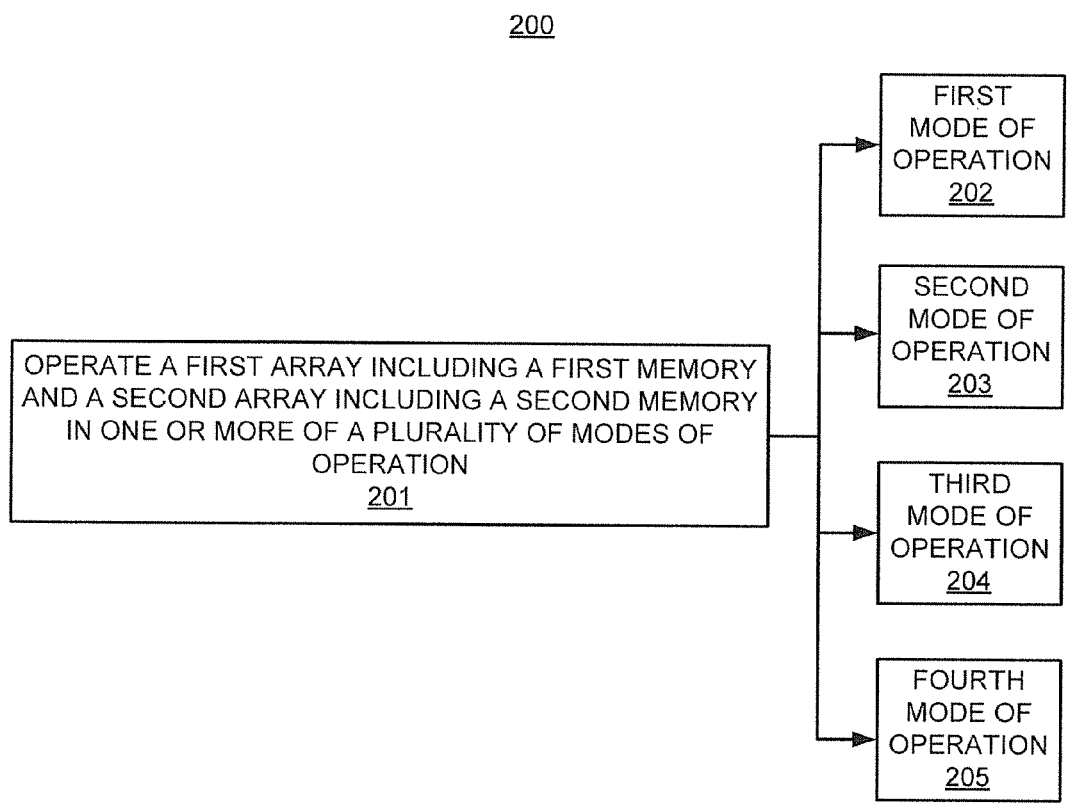
FIG. 4 illustrates a method for multi-mode storage, according to an example of the present disclosure.

FIG. 4 illustrates a flowchart of a method 200 for multi-mode storage, corresponding to the example of the multi-mode storage apparatus 100 whose construction is described in detail above. The method 200 may be implemented on the multi-mode storage apparatus 100 with reference to FIG. 1 by way of example and not limitation. The method 200 may be practiced in other apparatus.

Referring to FIG. 4, for the method 200, at block 201, a first array including a first memory and a second array including a second memory may be operated in one or more of a plurality of modes of operation. For example, referring to FIG. 1, a first array (i.e., first, relatively large, array 101) including a first memory and a second array (i.e., second, relatively smaller, array 102) including a second memory may be operated by the mode control module 105 in a plurality of modes of operation. The first memory may be a relatively denser memory compared to the second memory and the second memory may be a relatively faster memory compared to the first memory.

At block 202, the plurality of modes of operation may include a first mode of operation where the first array functions as the relatively denser memory and the second array functions as the relatively faster memory. Operating the first array and the second array in the first mode of operation may include assigning a portion of the dataset that has a higher response time sensitivity and is below a predetermined size for placement in the second array, and assigning a remaining portion of the dataset to the first array.

At block 203, the plurality of modes of operation may include a second mode of operation where the second array is operated as an automatic cache of a portion of a dataset. Operating the first array and the second array in the second mode of operation may include temporarily buffering data related to incoming writes in the second array, acknowledging the incoming writes as being committed to a sender, and releasing the data related to the incoming writes from the second array after being written to the first array. Operating the first array and the second array in the second mode of operation may further include determining if data related to incoming reads is present in the second array, and fetching the data related to the incoming reads from the first array if the data related to the incoming reads is not present in the first array. Operating the first array and the second array in the second mode of operation may further include holding data related to incoming reads in the second array for a predetermined period of time for further access to the data related to the incoming reads.

At block 204, the plurality of modes of operation may include a third mode of operation where a cache-tag functionality used to support the second mode of operation is instead used to provide a CAM. Operating the first array and the second array in the third mode of operation may further include operating the second array as the CAM, and operating the first array as the relatively denser memory.

At block 205, the plurality of modes of operation may include a fourth mode of operation where CAM functionality of the third mode of operation is provided for storing and retrieving key-value pairs. Operating the first array and the second array in the fourth mode of operation may further include using the second array to store the key-value pairs. Using the second array to store key-value pairs may further include using the first array to store the key-value pairs if the second array is filled, and using the second array to store pointers to locations in the first array to the key-value pairs stored in the first array. For the fourth mode of operation, the method may further include using match fields of the second array to store keys, and using data fields of the second array with the match fields to store an associated data value or a pointer to a location of storage of the data value.

FIG. 5 shows a computer system 300 that may be used with the embodiments described herein. The computer system 300 may represent a generic platform that may include components that may be in a server or another computer system. The computer system 300 may be used as a platform for the apparatus 100. The computer system 300 may execute, by a processor or other hardware processing circuit, the methods, functions and other processes described herein. These methods, functions and other processes may be embodied as machine readable instructions stored on computer readable medium, which may be non-transitory, such as, for example, hardware storage devices (e.g., RAM (random access memory), ROM (read only memory), EPROM (erasable, programmable ROM), EEPROM (electrically erasable, programmable ROM), hard drives, and flash memory).

The computer system 300 may include a processor 302 that may implement or execute machine readable instructions performing some or all of the methods, functions and other processes described herein. Commands and data from the processor 302 may be communicated over a communication bus 304. The computer system 300 may also include a main memory 306, such as, for example, a random access memory (RAM), where the machine readable instructions and data for the processor 302 may reside during runtime, and a secondary data storage 308, which may be non-volatile and stores machine readable instructions and data. The memory and data storage may be examples of computer readable mediums. The memory 306 may include a multi-mode storage module 320 including machine readable instructions residing in the memory 306 during runtime and executed by the processor 302. The multi-mode storage module 320 may include the modules of the apparatus 100 shown in FIG. 1.

The computer system 300 may include an I/O device 310, such as, for example, a keyboard, a mouse, a display, etc. The computer system 300 may include a network interface 312 for connecting to a network. Other known electronic components may be added or substituted in the computer system 300.

While the embodiments have been described with reference to examples, various modifications to the described embodiments may be made without departing from the scope of the claimed embodiments.

What is claimed is:

1. A method for multi-mode storage, the method comprising:
operating, by a processor, a first array including a first memory and a second array including a second memory in at least one of a plurality of modes of operation, wherein the first memory is a relatively denser memory compared to the second memory and the second memory is a relatively faster memory compared to the first memory, the modes of operation comprising:
a first mode of operation where the first array functions as the relatively denser memory compared to the second memory and the second array functions as the relatively faster memory compared to the first memory,
a second mode of operation where the second array is operated as an automatic cache of a portion of a dataset, and
a third mode of operation where a cache-tag functionality used to support the second mode of operation is instead used to provide a content-addressable memory (CAM).

2. The method of claim 1, wherein the first array is larger compared to the second array.

3. The method of claim 2, wherein operating the first array and the second array in the first mode of operation further comprises:
assigning a portion of the dataset that has a higher response time sensitivity compared to a remaining portion of the dataset and is below a predetermined size for placement in the second array; and
assigning the remaining portion of the dataset to the first array.

4. The method of claim 2, wherein operating the first array and the second array in the second mode of operation further comprises:
temporarily buffering data related to incoming writes in the second array;
acknowledging the incoming writes as being committed to a sender; and
releasing the data related to the incoming writes from the second array after being written to the first array.

5. The method of claim 2, wherein operating the first array and the second array in the second mode of operation further comprises:
determining if data related to incoming reads is present in the second array; and
fetching the data related to the incoming reads from the first array if the data related to the incoming reads is not present in the first array.

6. The method of claim 2, wherein operating the first array and the second array in the second mode of operation further comprises:
holding data related to incoming reads in the second array for a predetermined period of time for further access to the data related to the incoming reads.

7. The method of claim 2, wherein operating the first array and the second array in the third mode of operation further comprises:
operating the second array as the CAM; and
operating the first array as the relatively denser memory.

8. The method of claim 1, further comprising:
a fourth mode of operation where CAM functionality of the third mode of operation is provided for storing and retrieving key-value pairs.

9. The method of claim 3, wherein the first array is larger compared to the second array, wherein operating the first array and the second array in the fourth mode of operation further comprises:
using the second array to store the key-value pairs.

10. The method of claim 9, wherein using the second array to store key-value pairs further comprises:
using the first array to store the key-value pairs if the second array is filled; and
using the second array to store pointers to locations in the first array to the key-value pairs stored in the first array.

11. The method of claim 9, further comprising:
using match fields of the second array to store keys; and
using data fields of the second array with the match fields to store an associated data value or a pointer to a location of storage of the data value.

12. A multi-mode storage apparatus comprising:
a memory storing machine readable instructions to:
  operate a first array including a first memory and a second array including a second memory in at least one of a plurality of modes of operation, wherein the first memory is a relatively denser memory compared to the second memory and the second memory is a relatively faster memory compared to the first memory, the modes of operation comprising:
    a first mode of operation where the first array functions as the relatively denser memory compared to the second memory and the second array functions as the relatively faster memory compared to the first memory,
    a second mode of operation where the second array is operated as an automatic cache of a portion of a dataset,
    a third mode of operation where a cache-tag functionality used to support the second mode of operation is instead used to provide a content-addressable memory (CAM), and
    a fourth mode of operation where CAM functionality of the third mode of operation is provided for storing and retrieving key-value pairs; and
a processor to implement the machine readable instructions.

13. The multi-mode storage apparatus of claim 12, wherein the machine readable instructions to operate the first array and the second array in the third mode of operation further comprise machine readable instructions to:
operate the second array as the CAM; and
operate the first array as the relatively denser memory.

14. The multi-mode storage apparatus of claim 12, wherein the machine readable instructions to operate the first array and the second array in the fourth mode of operation further comprise machine readable instructions to:
use the second array to store the key-value pairs.

15. A non-transitory computer readable medium having stored thereon machine is readable instructions for multi-mode storage, the machine readable instructions when executed cause a computer system to:
  operate, by a processor, a first array including a first memory and a second array including a second memory in at least one of a plurality of modes of operation, wherein the first memory is a relatively denser memory compared to the second memory and the second memory is a relatively faster memory compared to the first memory, the modes of operation comprising:
    a first mode of operation where the first array functions as the relatively denser memory compared to the second memory and the second array functions as the relatively faster memory compared to the first memory,
    a second mode of operation where the second array is operated as an automatic cache of a portion of a dataset, and
    a third mode of operation where a cache-tag functionality used to support the second mode of operation is instead used to provide a content-addressable memory (CAM) by operating the second array as the CAM, and operating the first array as the relatively denser memory.

* * * * *

UNITED STATES PATENT AND TRADEMARK OFFICE
CERTIFICATE OF CORRECTION

PATENT NO. : 9,165,088 B2  
APPLICATION NO. : 13/936986  
DATED : October 20, 2015  
INVENTOR(S) : Robert J. Brooks It is certified that error appears in the above-identified patent and that said Letters Patent is hereby corrected as shown below:

In the Claims

In column 10, line 9 approx., in Claim 15, delete "machine is" and insert -- machine --, therefor.

Signed and Sealed this  
Twelfth Day of July, 2016

Michelle K. Lee  
*Director of the United States Patent and Trademark Office*